(12) United States Patent
Jeon et al.

(10) Patent No.: US 12,347,836 B2
(45) Date of Patent: Jul. 1, 2025

(54) VEHICLE BATTERY SYSTEM AND METHOD FOR DETECTING AND COPING WITH SWELLING PHENOMENON

(71) Applicant: SEOYON E-HWA CO., LTD., Anyang (KR)

(72) Inventors: Jong Hwan Jeon, Anyang (KR); Tae Gyung Kim, Seongnam (KR)

(73) Assignee: SEOYON E-HWA CO., LTD., Anyang (KR)

( * ) Notice: Subject to any disclaimer, the term of this patent is extended or adjusted under 35 U.S.C. 154(b) by 518 days.

(21) Appl. No.: 17/938,348

(22) Filed: Oct. 6, 2022

(65) Prior Publication Data

US 2023/0113670 A1   Apr. 13, 2023

(30) Foreign Application Priority Data

Oct. 7, 2021 (KR) .................. 10-2021-0133144

(51) Int. Cl.
| | |
|---|---|
| *H01M 10/48* | (2006.01) |
| *G01B 21/32* | (2006.01) |
| *G01R 31/367* | (2019.01) |
| *H01M 10/42* | (2006.01) |
| *H01M 50/411* | (2021.01) |

(52) U.S. Cl.
CPC .......... *H01M 10/482* (2013.01); *G01B 21/32* (2013.01); *G01R 31/367* (2019.01); *H01M 10/425* (2013.01); *H01M 10/4257* (2013.01); *H01M 10/486* (2013.01); *H01M 50/411* (2021.01); *H01M 2010/4271* (2013.01)

(58) Field of Classification Search
CPC .... H01M 10/48; H01M 10/482; H01M 10/63; H01M 10/633; H01M 10/425; H01M 10/4257; H01M 2010/4271; G01R 31/367; G01B 21/32
See application file for complete search history.

(56) References Cited

U.S. PATENT DOCUMENTS

2019/0363407 A1 *  11/2019  Noh ..................... H01M 10/46

FOREIGN PATENT DOCUMENTS

KR      20190084775 A      7/2019

* cited by examiner

*Primary Examiner* — Christopher P Domone
(74) *Attorney, Agent, or Firm* — Harvest IP Law, LLP

(57) ABSTRACT

According to an aspect of the present disclosure, there may be provided a battery system including a plurality of battery cells, polyurethane (PU) foam arranged between the plurality of battery cells, a strain gauge disposed on a side surface of the battery cell, a cell management controller (CMC) that converts a signal received from the strain gauge and transmits the converted signal to a battery management system (BMS), and the BMS that determines a state of the battery cell through the signal received from the CMC, wherein the BMS determines that a swelling phenomenon occurs when the signal input to the CMC is transmitted to the BMS and a time during which a value of the signal exceeds a set limit value continues for a set time or more due to a resistance value converted by the strain gauge, and thus an automatic coping operation is implemented, and the BMS is normally operated when the time during which the value of the signal transmitted to the BMS exceeds the set limit value is not greater than the set time.

5 Claims, 5 Drawing Sheets

VEHICLE BATTERY SYSTEM AND METHOD FOR DETECTING AND COPING WITH SWELLING PHENOMENON

CROSS-REFERENCE TO RELATED APPLICATION

This application claims priority to and the benefit of Korean Patent Application No. 10-2021-0133144 filed on Oct. 7, 2021, the disclosure of which is incorporated herein by reference in its entirety.

BACKGROUND

1. Field of the Invention

The present disclosure relates to a system and method for detecting a swelling phenomenon of a battery applied to a vehicle.

2. Discussion of Related Art

Due to the rapid increase in the use of fossil fuels, the demand for the use of alternative energy or clean energy is increasing, and as an example, the most actively researched fields are power generation fields and power storage fields using electrochemistry.

Currently, a battery is a representative example of an electrochemical element using such electrochemical energy, and the usage region thereof is gradually being expanded.

In recent years, as the technology development and demand for portable devices such as portable computers, portable phones, and cameras has increased, the demand for batteries as an energy source has rapidly increased. Lithium batteries having a long lifecycle and a low self-discharge rate have been commercialized, and thus much related research has been conducted.

In particular, pouch-type batteries have excellent product applicability because the structure of the pouch-type battery may be modified in various shapes to satisfy the requirements of customers and are more advantageous for multi-variety and small-volume production than batteries using metal can-type battery cases.

Meanwhile, when an abnormal situation such as overcharging, overdischarging, and internal short circuits due to storage at a high temperature for a long time and failure of a charger or a front control circuit occurs, a battery cell according to the related art swells due to a swelling phenomenon caused by decomposition of electrolytes or side reactions.

In the swelling phenomenon of the battery cell, since there is no device by which a driver may recognize the swelling phenomenon in advance, a fire occurs due to an explosion of the battery, resulting in a risk to property and life.

In order to solve such a problem, the swelling phenomenon is detected in various manners, and thus accidents are prevented. As an example, Korean Patent Application Publication No. 10-2019-0084775 discloses a battery module provided with a charging unit that is deformed into a structure that is efficiently cooled.

RELATED ART DOCUMENT

Patent Document (Patent Document 1) Korean Patent Application Publication No. 10-2019-0084775 (published on Jul. 17, 2019)

SUMMARY OF THE INVENTION

The present disclosure is directed to providing a battery system in which a swelling phenomenon of a battery occurring in the conventional method is detectable to prevent accidents.

According to an aspect of the present disclosure, there may be provided a battery system and method including eight battery cells formed in an angular shape or a pouch shape and formed in a bundle, three polyurethane (PU) foams arranged between the battery cells to form a predetermined interval, a strain gauge coupled to one side of the battery cell, cell management controllers (CMCs) of which the number corresponds to the battery cells and which transmit signals so that the battery cells are controlled and operated in units of cells, and a battery management system (BMS) to which a signal transmitted from the strain gauge and received by the CMC is transmitted and which determines a cell state by a BMS software algorithm and transmits operation signals of the battery cells.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, embodiments of the present disclosure will be described with reference to the accompanying drawings. The following embodiments may be provided more completely describe the present disclosure to those skilled in the art. However, the following embodiments are provided to help the understanding of the present disclosure, and the technical spirit of the present disclosure is not necessarily limited to the following embodiments. Further, detailed descriptions that make the subject matter of the present disclosure unclear or correspond to the well-known configurations will be omitted.

Figure 1:
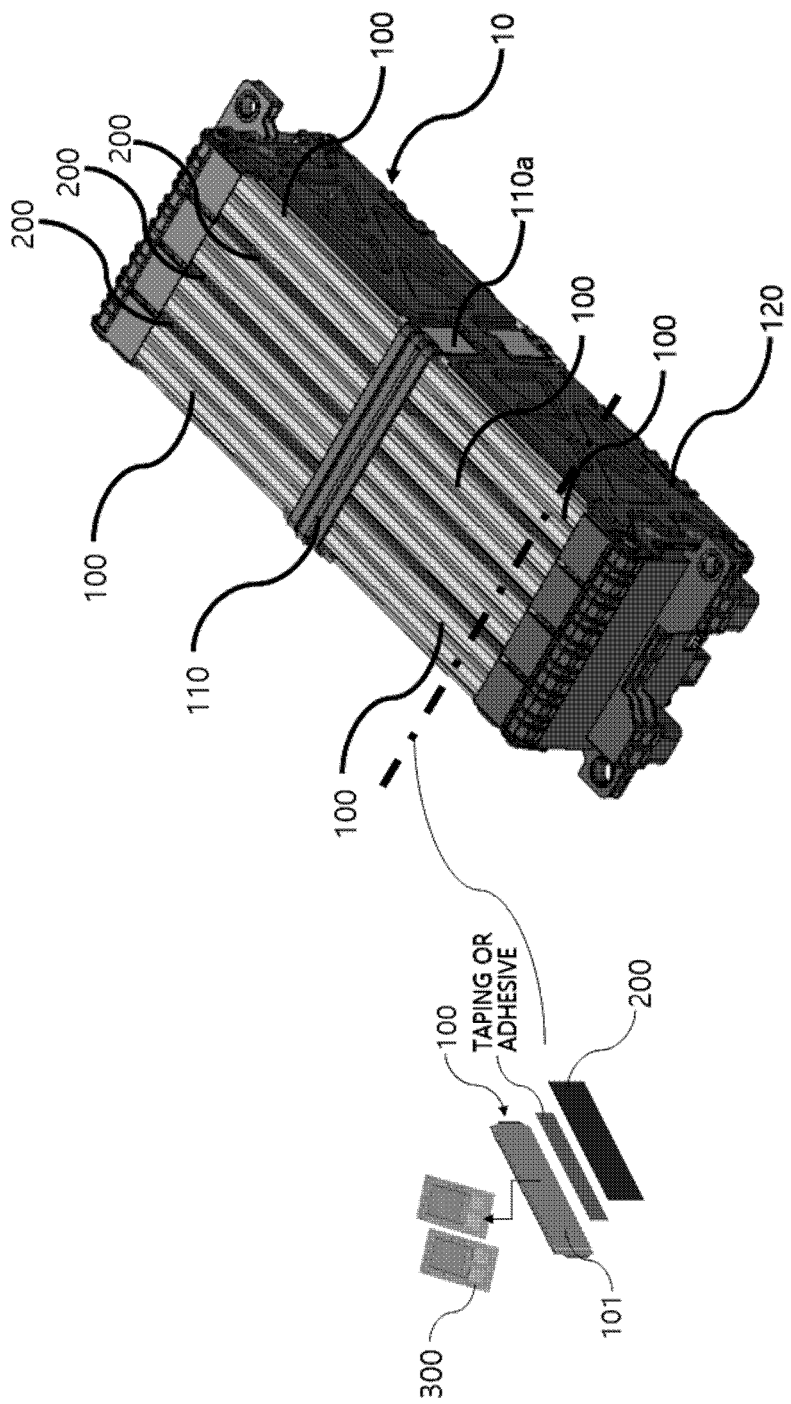
FIG. 1 is an exploded view a battery cell system according to the present disclosure and one side thereof.

FIG. 1 is an exploded view a battery cell system according to the present disclosure and one side thereof.

Referring to FIG. 1, a vehicle battery system (hereinafter, referred to as a system) according to the present embodiment may include a plurality of battery cells 100.

The battery cell 100 may have an angular shape or a pouch shape. The system according to the present embodiment may effectively perform a function in the battery cell 100 having substantially an angular shape or a pouch shape. However, the present disclosure is not necessarily limited thereto. In some cases, the battery cell 100 may include other types of battery cells that require detection of swelling in addition to the battery cell having an angular shape or a pouch shape.

A plurality of battery cells 100 may be provided. The plurality of battery cells 100 may be provided in a bundle form by a binder 110. In general, the plurality of battery cells 100 combined in this way may be referred to as a battery module. Each of the battery cells 100 may be used in combination in series and/or parallel forms according to required performance. In the present embodiment, an example of a case in which four battery cells 100 are arranged in two rows and thus eight battery cells 100 are combined is described. However, the number or arrangement of the battery cells 100 may be appropriately changed as needed and is not necessarily limited to the example.

The battery cell 100 may be provided with a polyurethane foam adhesive surface 101 (hereinafter, a PU foam adhesive surface). The PU foam adhesive surface 101 may be formed on a left surface and/or a right surface of the battery cell 100. The surface of the PU foam adhesive surface 101 may be smoothly processed through finishing processing. Further, the PU foam adhesive surface 101 may be formed as substantially a flat surface with no curvature.

A polyurethane foam 200 (hereinafter, a PU foam) may be attached to the PU foam adhesive surface 101.

The PU foam 200 may be positioned between side surfaces of the adjacent battery cells 100 so that the respective battery cells 100 may be spaced apart from each other. In the present embodiment, an example of a case in which three PU forms 200 are arranged between four battery cells 100 in each row is described. A plurality of arrangement structures of the battery cells 100 and the PU foams 200 may be provided, and the number of the PU foams 200 may be changed according to the number or arrangement of the battery cells 100, but the present disclosure is not necessarily limited to the example.

The PU foam 200 may be formed in the form of a sheet having a predetermined thickness. Each of the PU foams 200 may have a predetermined thickness so that the battery cells 100 may be arranged at equal intervals. The PU foam 200 may partially absorb an external impact applied to the battery cell 100. Preferably, the PU foam 200 may have a sufficient thickness to prevent each of the battery cells 100 from coming into contact with each other due to vibration generated while a vehicle travels. As a detailed example, the thickness of the PU foam 200 may be in the range of about 3 mm to 5 mm. However, the thickness of the PU form 200 may be variously changed according to internal and external environmental conditions, and the present disclosure is not necessarily limited to the example.

A part or the entirety of the PU foam 200 may be formed of a flame-retardant material or may include a flame-retardant material. Further, the PU foam 200 may be coupled to a side surface of the battery cell 100 through an adhesive, a tape, or the like.

Meanwhile, the battery cell 100 and the PU foam 200 may be coupled in the form of one bundle by the binder 110. A part or the entirety of the binder 110 may be formed of an insulating material or may include an insulating material.

The binder 110 may be coupled to a battery pack case 120 surrounding an outer side of the battery cell 100. Two battery pack cases 120 may be positioned in contact with each other on a left side and a right side corresponding to an outer side on which the PU foam 200 is not coupled to the battery cell 100. An end of the binder 110 may be coupled to and supported by a binder groove 110a formed outside the two battery pack cases 120. Further, a pair of binders 110 may be provided on upper and lower sides of the battery cell 100 and may be coupled in contact with upper and lower surfaces of the battery cell 100.

Meanwhile, the system according to the present embodiment may include a strain gauge 300.

The strain gauge 300 may be coupled to a side surface of the battery cell 100. The strain gauge 300 may include a film-type strain gauge 300. The strain gauge 300 may include a variable resistance type in which the strain gauge 300 is formed in a predetermined area and extends to one side when a phase change is detected so that a resistance value of a protruding pin is varied. The strain gauge 300 may be disposed in direct contact with an outer surface of the battery cell 100. However, the type or installation form of the strain gauge 300 is not necessarily limited to the above configuration.

As an example, the strain gauge 300 may be disposed in a form impregnated in the PU foam 200. In this case, the strain gauge 300 may detect all changes in the battery cells 100 in contact with both left and right sides thereof. However, when a distance between the strain gauge 300 and the outer surface of the battery cell 100 is too large, the sensitivity may be low. Thus, in the above case, it should be noted that an interval between the strain gauge 300 and the battery cell 100 is not too large.

Meanwhile, the system according to the present embodiment may include a cell management controller (CMC) 400 that receives a signal from the strain gauge 300.

Figure 2:
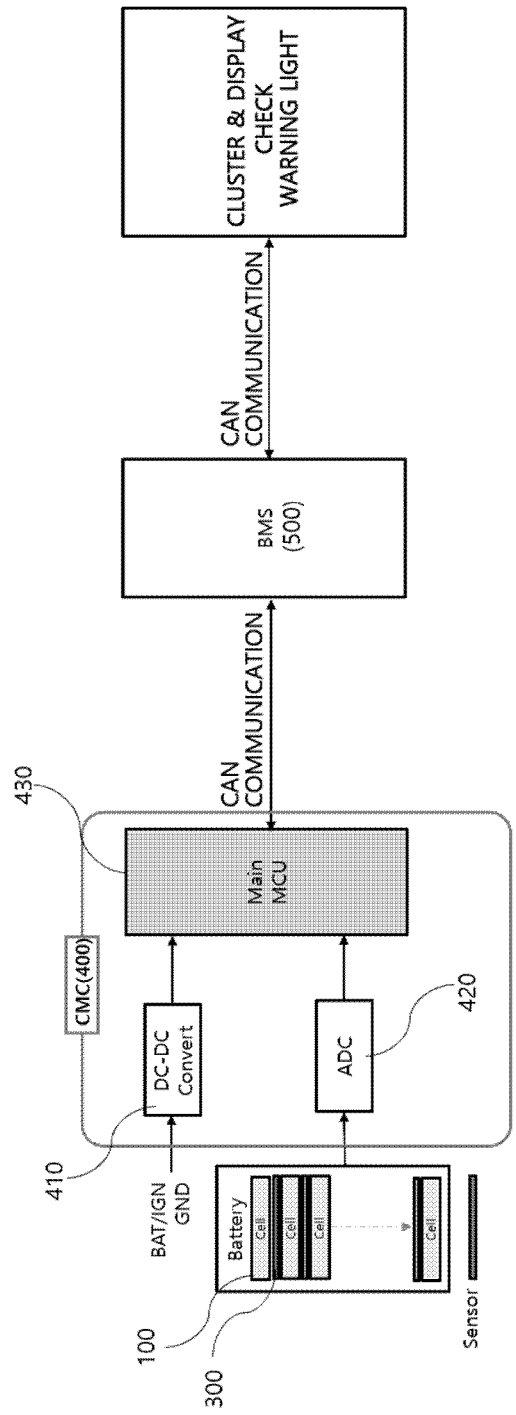
FIG. 2 is a diagram illustrating a signal transmission process of a battery cell system according to the present embodiment.

FIG. 2 is a schematic view illustrating a signal transmission process in the system of FIG. 1.

Referring to FIG. 2, when swelling occurs in the battery cell 100, a resistance value of the strain gauge 300 may be changed due to the phase change of the battery cell 100. A change in the resistance value of the strain gauge 300 may be signaled to the CMC 400. The CMC 400 may separately monitor the received signal.

Further, the CMC 400 may provide a signal received through a controller area network (CAN) to a battery management system (BMS) 500, and in response thereto, the BMS 500 may display visual and auditory information through an in-vehicle driver assistance device.

Figure 3:
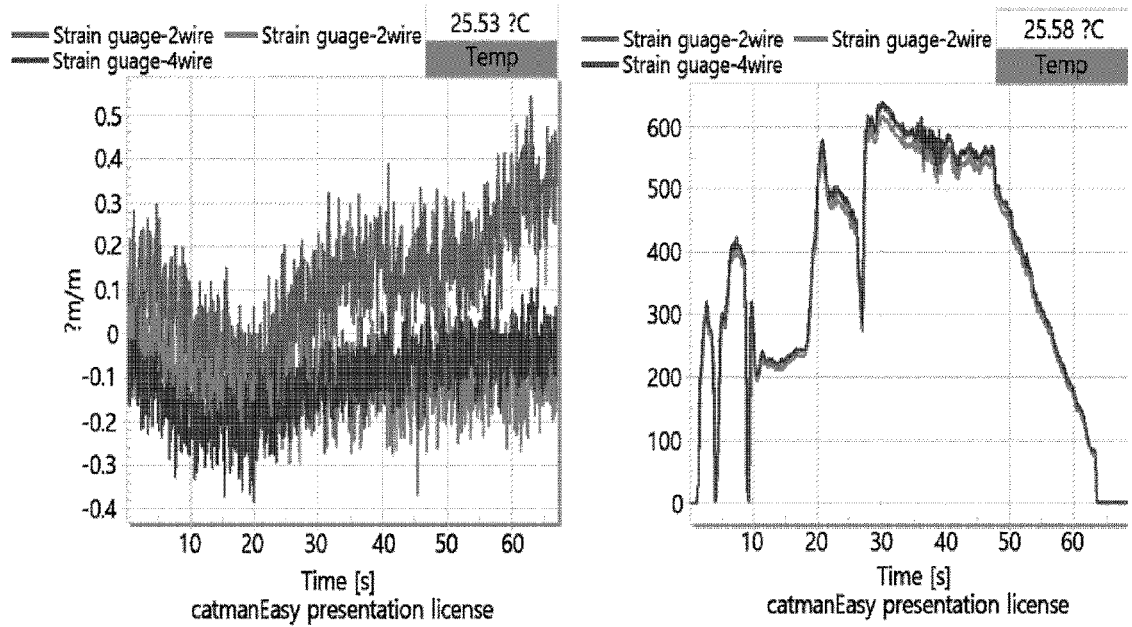
FIG. 3 is a view illustrating a monitoring screen that shows a signal transmitted to a cell management controller (CMC)

FIG. 3 is an exemplary view illustrating a monitoring screen that shows the signal transmitted to the CMC in the system of FIG. 1.

Referring to FIGS. 2 and 3, the signal detected by the strain gauge 300 may be monitored by the CMC 400. Here, the monitored signal may be obtained by converting an analog signal transmitted from the strain gauge 300 into a digital signal through an analog-to-digital converter (ADC) 420 as in a left graph of FIG. 3.

Meanwhile, electric power may be converted into an appropriate voltage used in the CMC 400 through a DC-DC converter 410 and supplied to the CMC 400. Further, the CMC 400 may include a main micro-controller unit (main MCU) 430 that receives and processes the signal digitized through the ADC 420.

In the main MCU 430, a process of sampling the signal transmitted from the ADC 420 and converting the sampled signal into data applied to an algorithm as in a right graph of FIG. 3 may be performed. Here, the algorithm may include a series of processes for determining whether the battery swells. The data derived by the algorithm may be transmitted to the BMS 500, and the BMS 500 may determine a state of the battery cell through a BMS software algorithm.

Figure 4A:
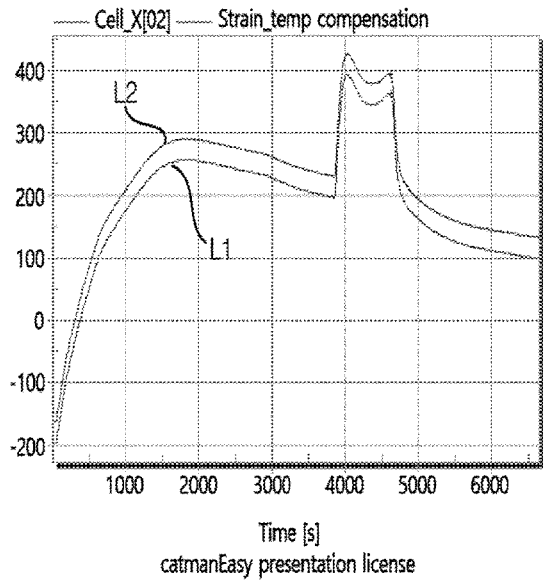
FIG. 4A is a graph illustrating an example of data for applying an algorithm in the system of FIG. 1.
Figure 4B:
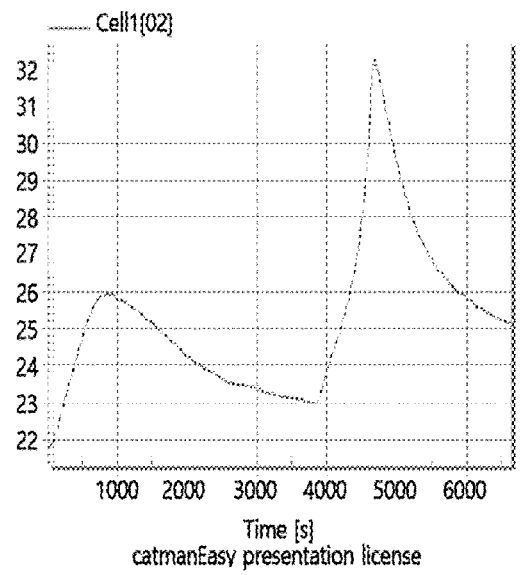
FIG. 4B is a graph illustrating a temperature that is an independent variable of an equation for correcting the data of FIG. 4A.

FIG. 4A is a graph illustrating an example of data for applying an algorithm in the system of FIG. 1. FIG. 4B is a graph illustrating a temperature that is an independent variable of an equation for correcting the data of FIG. 4A. In FIG. 4A, an x axis denotes a time(s), and a y axis denotes a displacement. Meanwhile, in FIG. 4B, an x axis denotes a time(s), and a y axis denotes a temperature.

Referring to FIGS. 4A and 4B, in a result of monitoring a signal detected by the CMC 400, when a temperature rises, the data may be corrected.

In the graph of FIG. 4A, it may be identified that a line L1 has a y-axis peak value in a period of 4000 to 5000 seconds. Here, a line L2 of FIG. 4A may be a graph obtained by correcting the line L1 by applying an algorithm logic to the temperature illustrated in the graph of FIG. 4B. In other words, the line L2 is a graph illustrating a result of correcting the line L1 by a value obtained by calculating the temperature illustrated in the graph of FIG. 4B by a software algorithm logic. In this way, the monitoring result of the signal detected by the CMC 400 according to the present disclosure may represent a result value corrected according to the temperature.

As in FIG. 4, when a temperature change occurs in a measurement portion of the strain gauge, thermal deformation occurs in the measured value by the strain gauge, and thus correction may be required. Accordingly, the main MCU 430 may convert the line L1 into a graph such as the line L2 by the software algorithm logic by applying a correction value that varies according to the temperature. In other words, the line L2 in the FIG. 4A may be a correction value applied by substituting a temperature value measured in FIG. 4B to a value of the line L1. In this case, the correction value applied to the applied software algorithm logic may be a value derived by an equation using a temperature value as a variable.

In the battery system, a temperature change may be formed when the battery cell is charged or discharged. In the battery system provided with both a temperature sensor and the strain gauge 300 in such a temperature change, the temperature value detected by the temperature sensor is applied to the equation using a temperature value as a variable in the CMC 400, and thus a calculation of correcting a result value by the above-described software algorithm logic may be performed. Due to this correction, in the battery system, the strain gauge can be prevented from malfunctioning due to a change in temperature.

Figure 5:
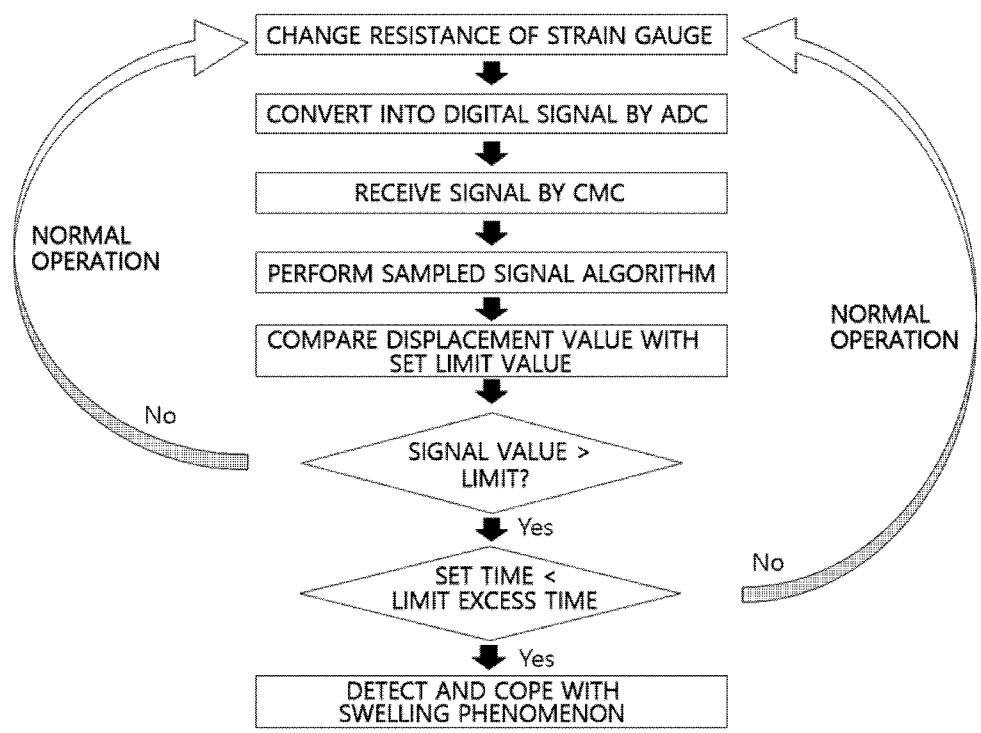
FIG. 5 is a flowchart illustrating a battery management system (BMS) software algorithm.

FIG. 5 is a flowchart illustrating an algorithm for determining a state of the battery cell in the system of FIG. 1.

Referring to FIG. 5, the BMS software algorithm may be applied to the system according to the present embodiment. First, when the battery cell 100 included in the system is swelled or contracted, the resistance value of the strain gauge 300 may be changed. Here, the resistance value changed in the strain gauge 300 may be transmitted to the ADC 420 and converted into a digital signal. Here, the resistance value converted into the digital signal by the ADC 420 may be transferred to the CMC 400. Further, the CMC 400 may sample the digital signal of the received resistance value. In this case, the signal sampled by the CMC 400 may be processed by the BMS software algorithm. Here, the sampled signal is a resistance value measured by the strain gauge and may be a displacement value of the battery cell. The BMS software algorithm may be a process of comparing a value of the sampled signal transmitted and received as a signal with a set limit value.

As an example, when the signal value exceeds the set limit value, it may be identified that a swelling phenomenon is detected. Accordingly, the BMS 500 may transmit a signal so that an operation of coping with the swelling phenomenon may be implemented. Further, when the signal value is greater than or equal to the set value, it is determined that a current state is an initial stage of the occurrence of the swelling phenomenon, and thus a next stage may be performed.

Figure 6A:
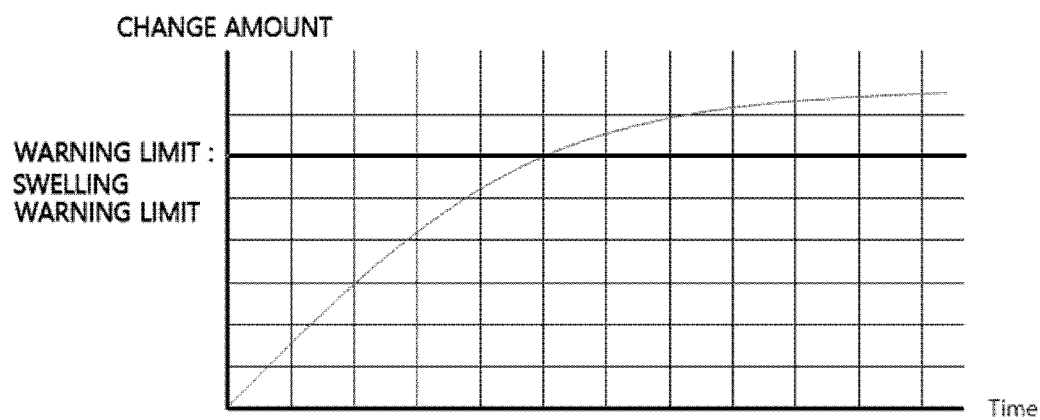
FIG. 6A is a graph illustrating a sampled digital signal that is detected as a swelling phenomenon according to an embodiment of the present disclosure.
Figure 6B:
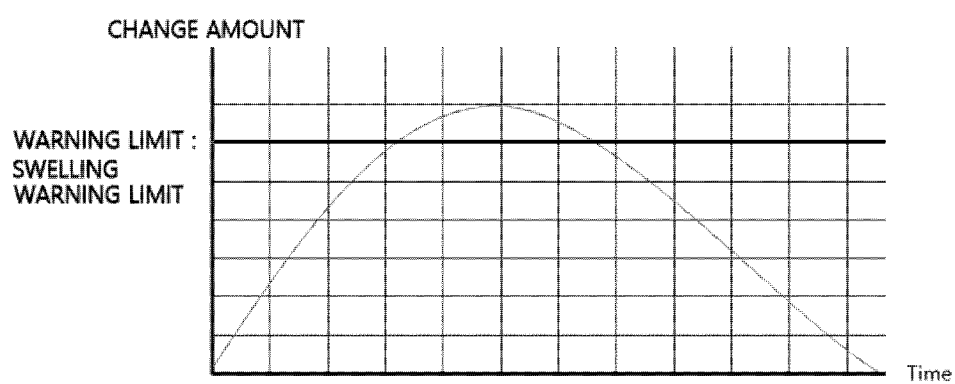
FIG. 6B is a graph illustrating a signal that is not detected as the swelling phenomenon.

FIG. 6A is a graph illustrating a sampled digital signal that is detected as a swelling phenomenon according to an embodiment of the present disclosure, and FIG. 6B is a graph illustrating a signal that is not detected as the swelling phenomenon.

Referring to FIGS. 5 and 6A, when the displacement value that is the signal value exceeds a swelling warning limit value illustrated in FIG. 6, the BMS software algorithm may be a process of identifying whether a state in which the signal value exceeds the swelling warning limit value is maintained for a set time. Here, when the state in which the signal value exceeds the set limit value is maintained for the set time or more, the BMS 500 may determine that the swelling phenomenon occurs, and thus an automatic coping operation may be implemented. In this case, the set value may be varied according to a state of the battery by a user's operation. In detail, the set time may be set to a time when a probability that a problem occurs increases.

Referring to FIGS. 5 and 6B, when the displacement value that is the signal value exceeds the swelling warning limit value corresponding to the set limit value illustrated in FIG. 6 but a time during which the displacement value exceeds the warning limit value exceeds the set time, the BMS 500 may determine that a current state is a normal state and proceed to a resistance change detection operation. In this process, swelling of about 10% of an area of the battery cell may occur in a situation in which the battery is rapidly charged or discharged. Here, the swelling corresponding to 10% of the area of the battery cell is a temporary phenomenon and does not cause a problem in operating the battery. Accordingly, the BMS software algorithm according to the present disclosure may be operated while distinguishing a problematic swelling phenomenon from the temporary swelling phenomenon occurring during charging or discharging by comparing the set time with the limit exceeding time. Here, when the swelling phenomenon occurs, the system according to the present disclosure may perform the automatic coping operation in the BMS 500.

The automatic coping operation performed by the BMS 500 may be, for example, an operation of power management of a battery. The operation of power management of the battery implemented by the automatic coping operation may limit a charging amount of the battery or cut off power of a battery pack when it is determined that the swelling phenomenon occurs.

As another example, the automatic coping operation performed by the BMS 500 may be an output operation to a dashboard. When the swelling phenomenon of the battery is detected, the BMS 500 may transmit an operation signal to a symbol having a specific form which is lit on the dashboard of the vehicle. Here, the symbol that is lit by receiving the operation signal from the BMS 500 may be lit while positioned in a speed meter of the dashboard or a central portion of the dashboard. By such a light signal, a driver can visually identify whether the vehicle is abnormal, and thus a user can intuitively grasp the problem.

As described above, in the battery cell swelling phenomenon detection system according to the present embodiments, the swelling phenomenon of the battery cell, which is caused by occurrence of a structural change of the inside of the battery cell when an electric vehicle battery is charged or discharged, is detected by alternately arranging the strain gauges and the battery cells, the automatic coping operation is performed by the algorithm, and thus accidents caused by the swelling phenomenon of the battery can be prevented.

In a battery cell swelling phenomenon detection system according to the present embodiments, a swelling phenomenon of a battery cell, which is caused by occurrence of a structural change of the inside of the battery cell when an electric vehicle battery is charged or discharged, is detected by alternately arranging strain gauges, an automatic coping operation is performed by an algorithm, and thus accidents can be prevented.

Hereinabove, embodiments of the present disclosure have been described. However, those skilled in the art can variously modify or change the present disclosure by adding, changing, and removing components without departing from the technical spirit of the present disclosure, and these modifications and changes are also included in the scope of the present disclosure.

What is claimed is:

1. A battery system comprising:
   a plurality of battery cells (100);
   a polyurethane (PU) foam (200) arranged between the plurality of battery cells (100);
   a strain gauge (300) disposed on a side surface of the battery cell (100);
   a cell management controller (CMC) (400) that converts a signal received from the strain gauge (300) and transmits the converted signal to a battery management system (BMS) (500); and
   the BMS (500) that determines a state of the battery cell (100) through the signal received from the CMC (400),
   wherein the BMS (500) determines that a swelling phenomenon occurs when the signal input to the CMC (400) is transmitted to the BMS (500) and a time during which a value of the signal exceeds a set limit value continues for a set time or more due to a resistance value converted by the strain gauge (300), and thus an automatic coping operation is implemented, and
   the BMS (500) is normally operated when the time during which the value of the signal transmitted to the BMS (500) exceeds the set limit value is not greater than the set time.

2. The battery system of claim 1, wherein the PU foam (200) is formed to have a thickness at which the battery cells (100) are arranged at equal intervals and is disposed between the battery cells (100).

3. The battery system of claim 1, wherein the CMC (400) includes:
   a direct current (DC)-DC converter (410) that converts a voltage into an appropriate voltage used in the CMC (400) and supplies the voltage;
   an analog-to-digital converter (420) that converts an analog signal transmitted from the strain gauge (300) into a digital signal and transmits the converted signal; and
   a main micro-controller unit (main MCU) (430) that receives power from the DC-DC converter (410), receives the signal from the ADC (420), and processes the signal.

4. The battery system of claim 3, wherein the main MCU (430) communicates with the BMS (500), and
   in the automatic coping operation, the signal is transmitted to perform a battery pack power management operation or an operation of lighting a symbol positioned in a speed meter of a dashboard or a central portion of the dashboard.

5. The battery system of claim 1, wherein a temperature sensor together with the strain gauge (300) is provided so that a correction value of a resistance value measured by the strain gauge (300) according to a measured temperature is derived by a software algorithm logic in the CMC (400) and a value to which the correction value is applied is monitored, and
   in the software algorithm logic, the correction value is derived by an equation using a temperature value as a variable.

\* \* \* \* \*